United States Patent
Lee (10) Patent No.: US 6,849,294 B2
(45) Date of Patent: Feb. 1, 2005

(54) METHOD FOR FABRICATING CIRCUIT PATTERN OF PRINTED CIRCUIT BOARD

(75) Inventor: Sung-Gue Lee, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/456,565

(22) Filed: Jun. 9, 2003

(65) Prior Publication Data
US 2004/0001914 A1 Jan. 1, 2004

(30) Foreign Application Priority Data

Jun. 26, 2002 (KR) ................................. 10-2002-0036108

(51) Int. Cl.$^7$ ............................................... B05D 5/12
(52) U.S. Cl. .................... 427/97.7; 427/98.2; 427/99.2; 427/99.3
(58) Field of Search .............................. 427/96, 97, 98; 205/125, 126; 29/846, 849, 852

(56) References Cited

U.S. PATENT DOCUMENTS

| | | | | |
|---|---|---|---|---|
| 5,705,430 A | * | 1/1998 | Avanzino et al. | 438/618 |
| 6,579,785 B2 | * | 6/2003 | Toyoda et al. | 438/597 |
| 2001/0023532 A1 | * | 9/2001 | Fujii et al. | 29/830 |

* cited by examiner

Primary Examiner—Brian K. Talbot
(74) Attorney, Agent, or Firm—Fleshner & Kim, LLP

(57) ABSTRACT

A circuit pattern fabrication method of a printed circuit board includes: a first step of forming a resin layer at a surface of an insulation material; a second step of selectively removing the resin layer; a third step of forming a metal plated layer at the surface of the resin layer-removed portion of the insulation material to form circuit patterns and a connection pad; and a fourth step of forming a gold plated layer on the connection pad. By doing that, a fine circuit pattern can be easily formed.

19 Claims, 11 Drawing Sheets

METHOD FOR FABRICATING CIRCUIT PATTERN OF PRINTED CIRCUIT BOARD

BACKGROUND OF THE INVENTION

1. Field of the Invention

The present invention relates to a printed circuit board and, more particularly, to a method for fabricating a circuit pattern of a printed circuit board that is capable of easily forming a fine pitch circuit pattern and improving a reliability.

2. Description of the Background Art

FIGS. 1A to 1J are sequential process of a method for fabricating a circuit pattern of a printed circuit board in accordance with a conventional art.

The process of fabricating a circuit pattern of a printed circuit board in accordance with a conventional art will now be described with reference to FIGS. 1A to 1J.

Figure 1A:
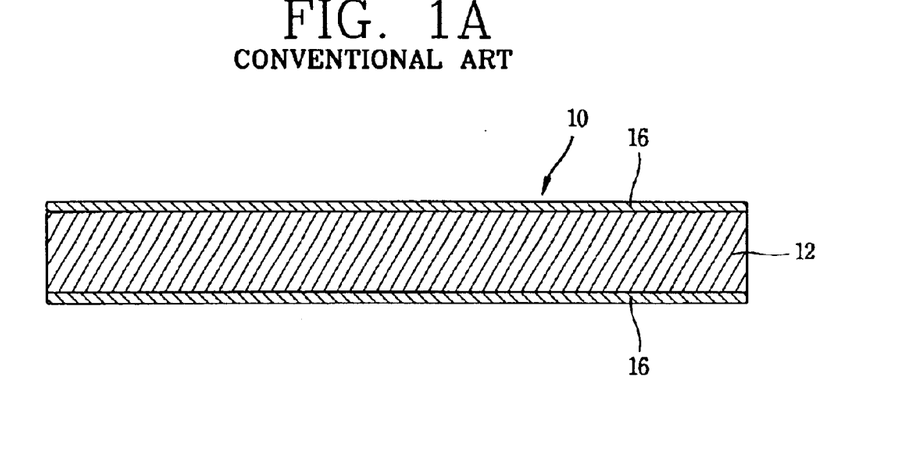
FIGS. 1A to 1J are a sequential process of a method for fabricating a circuit pattern of a printed circuit board in accordance with a conventional art.

First, as shown in FIG. 1A, a base material 10 is prepared. The base material 10 is formed by coating a copper foil 16 at both sides of an insulation material 12 with a predetermined thickness.

Figure 1B:
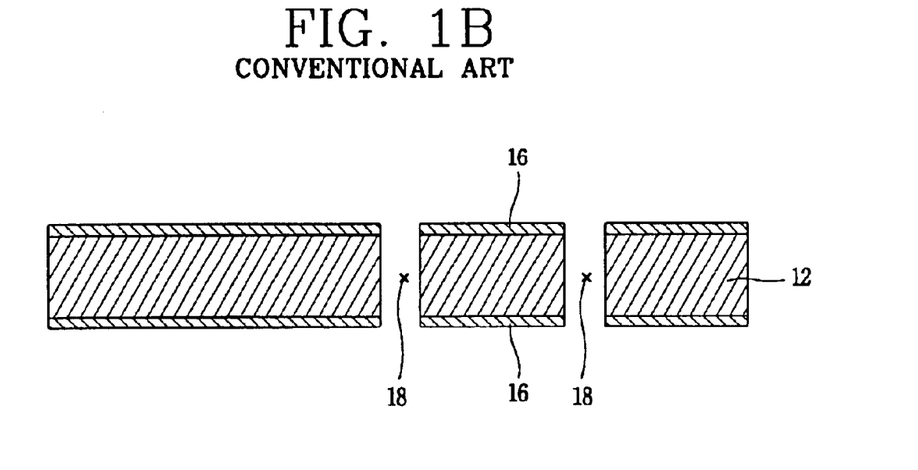

With reference to FIG. 1B, a plurality of through holes 18 are formed in the base material 10. The through holes 18 serve as a path for electrically connecting the copper foil coated at both sides of the insulation material 12, and as such it can be formed with various sizes and as many as desired according to a circuit design.

Figure 1C:
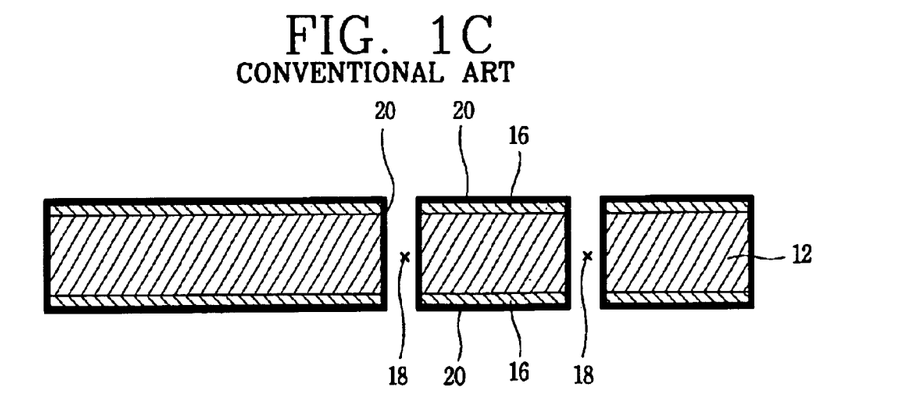

And then, as shown in FIG. 1C, after the through holes 18 are formed, a copper plated layer 20 is formed at a surface of the base material 10. That is, the copper plated layer 20 is formed also at the inner surface of the through holes 18 as well as at the surface of the copper foil 16, electrically connecting the copper foil 16 formed at both sides of the insulation material 12.

Figure 1D:
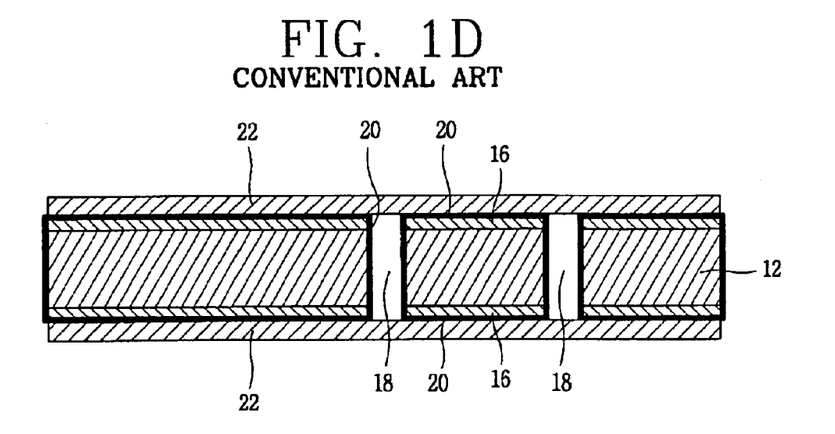
Figure 1E:
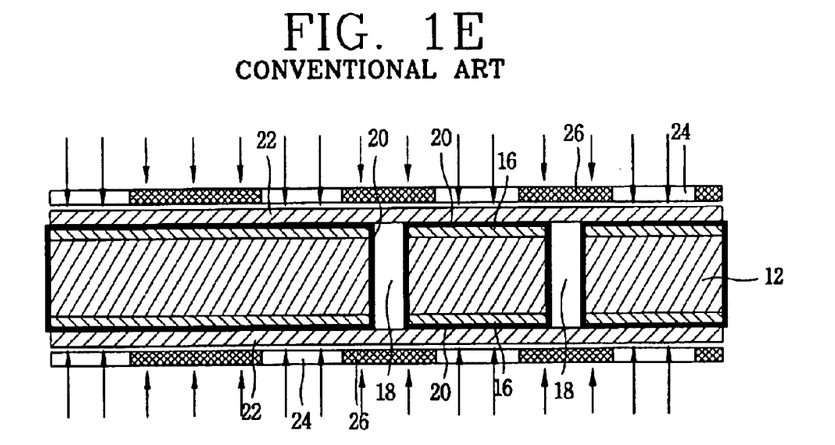

And, as shown in FIGS. 1D and 1E, an etching resist 22 is coated at the surface of the copper plated layer 20, which is then exposed. The exposing process is performed such that an exposing mask 26 with a plurality of openings 24 is positioned at both surfaces of the base material 10 with the etching resist 22 coated thereon, on which ultraviolet ray is irradiated, so that the ultraviolet ray is partially irradiated at the etching resist 22 through the openings 24 formed at the exposing mask 26.

Figure 1F:
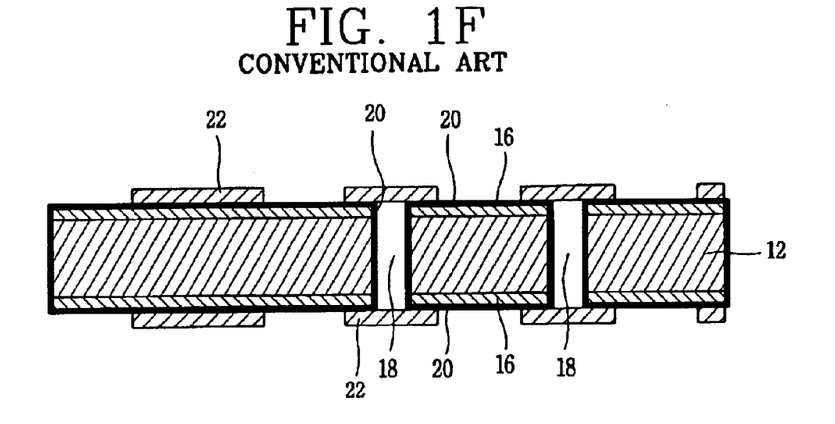

When the exposing process is completed, as shown in FIG. 1F, a development process proceeds to remove the etching resist 22 of the exposed portion. That is, the etching resist at the portion to which ultraviolet ray has been irradiated is removed to expose the copper plated layer 20, while the etching resist 22 without ultraviolet irradiated thereto as being covered by the exposed mask 26 remains, not exposing the copper plated layer 20.

Figure 1G:
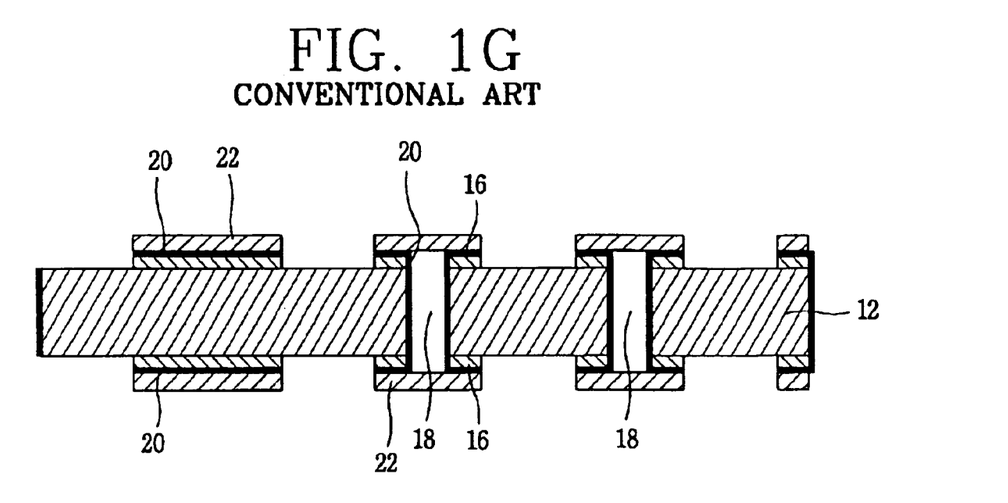

After the development process is completed, as shown in FIG. 1G, an etching process proceeds to remove the exposed copper plated layer 20 and the copper foil 16.

Figure 1H:
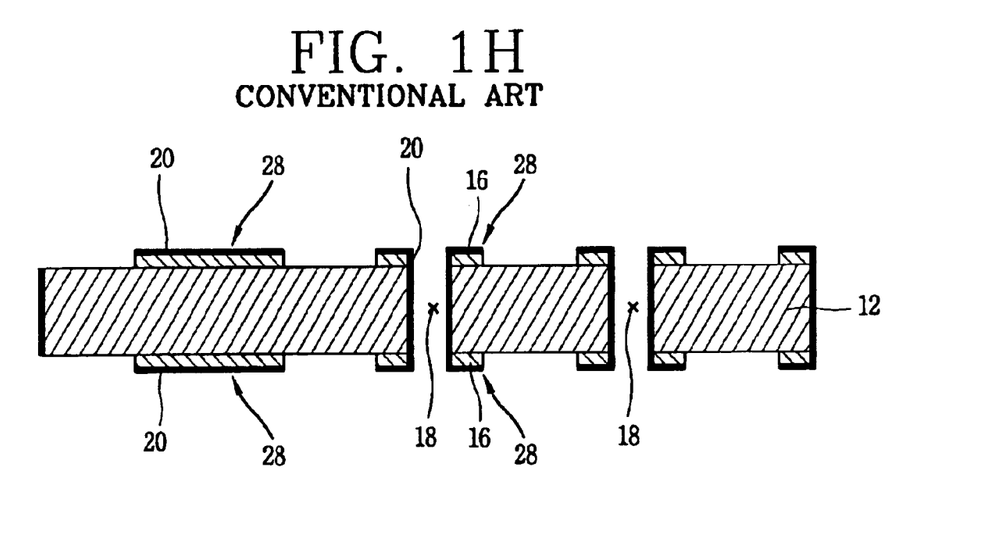

And then, as shown in FIG. 1H, the remaining etching resist 22 is removed. Then, the copper plated layer 20 remaining at both surfaces of the insulation 12 by being protected by the etching resist 22 and the copper foil 16 form a circuit patterns 28.

Figure 1I:
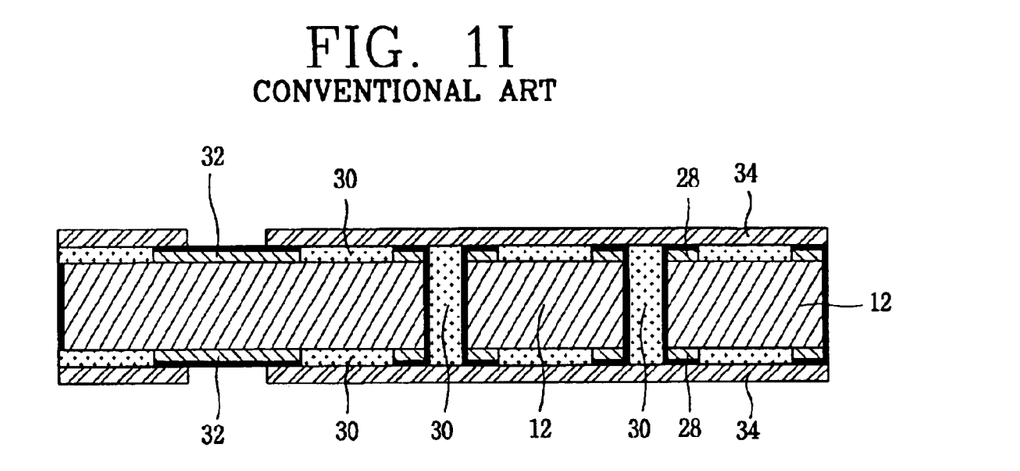

As the etching resist 22 is removed, as shown in FIG. 1I, a resin is plugged in the through hole 18 and regions between the circuit patterns 28 to form a resin layer 30. And then, a photoresist 34 is coated at a surface of the resin layer 30. At this time, some of the circuit patterns 28 are used as a connection pad 32 for electrical connection with outside and the photoresist 34 is not coated at the circuit pattern used as the connection pad 32.

That is, circuit patterns 28 are formed by the copper foil 16 and the copper plated layer 20 at both surfaces of the insulation material 12, and electrically connected to each other by the copper plated layer 20 coated at the inner surface of the through holes 18.

Figure 1J:
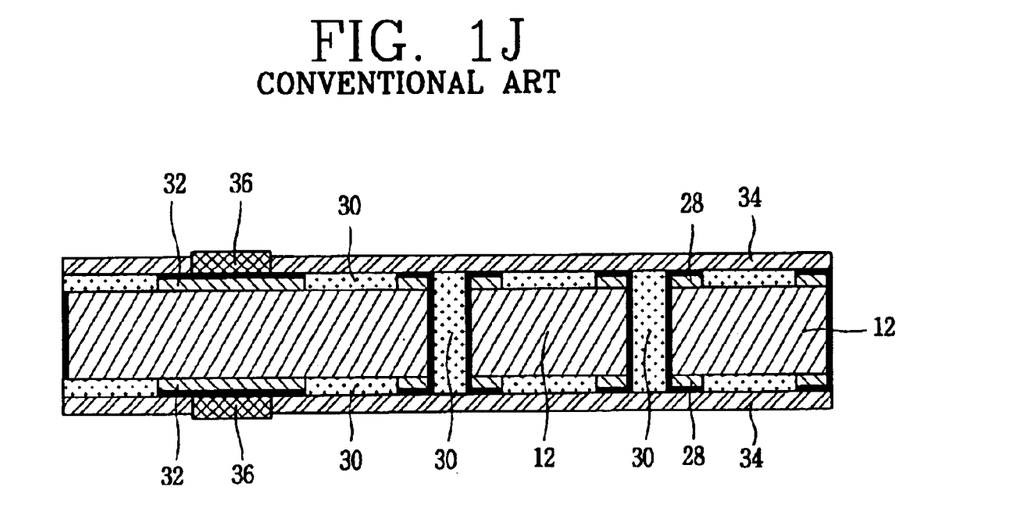

And then, as shown in FIG. 1J, a gold-plated layer 36 is formed on the portion of the connection pad 32 for connection to other electronic parts. The gold-plated layer 36 serves to ensure a firm attachment when a gold wire is connected to the connection pad 32 or a solder ball is formed on the connection pad 32.

Figure 2:
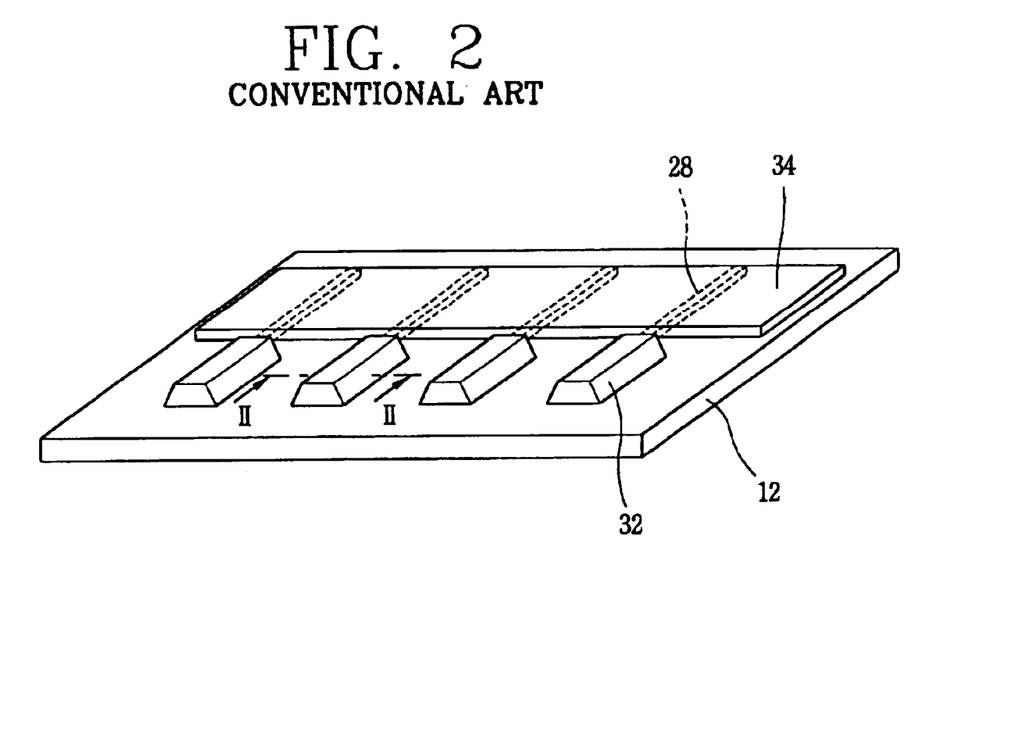
FIG. 2 is a partial perspective view showing a printed circuit board in accordance with the conventional art.
Figure 3:
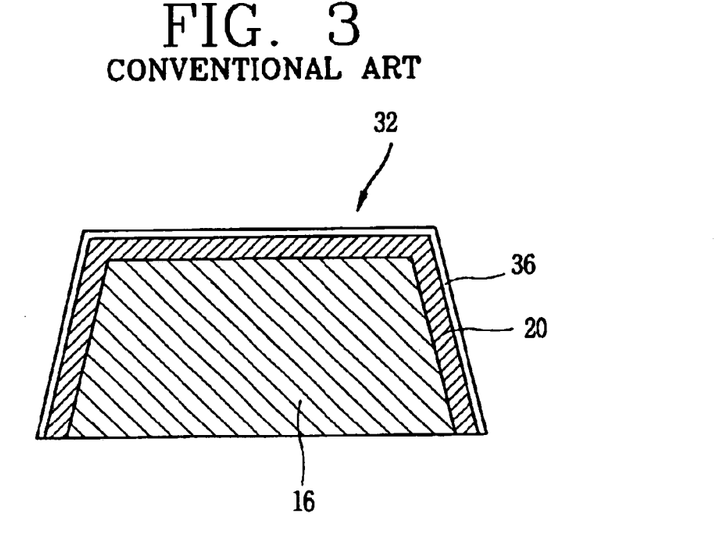
FIG. 3 is a sectional view taken along line III—III of FIG. 2.

FIG. 2 is a partial perspective view of the printed circuit board in accordance with the conventional art, and FIG. 3 is a sectional view showing the connection pad 32 with the gold plated layer 36 formed thereon in accordance with the conventional art.

To sum up, the printed circuit board in accordance with the conventional art has a structure that the circuit patterns 28 are formed at the surface of the insulation layer 12, on which the photoresist 34 is coated, and the gold plated layer 36 is formed at the connection pad 32, where no photoresist 34 is coated, for connecting with other electronic parts.

A printed circuit board such as a flip chip package or a chip scale package (CSP) having almost the same size as the semiconductor chip is in demand increasingly, and the connection pad is in the tendency of sharply increase in number as the semiconductor chip is of high density. Accordingly, in order to form more circuit patterns in the same area for a signal transmission with the semiconductor chip, the width and the thickness of the circuit pattern is reduced and a space between circuit patterns becomes fine.

However, the circuit pattern fabrication method of a printed circuit board in accordance with the conventional art has the following problems.

That is, first, because the circuit pattern 28 or the connection pad 32 is formed through the etching process, its bottom portion attached at the insulation layer 12 is relatively wide and becomes narrow as it goes to the upper portion, causing a problem that it is difficult to attach the gold wire or the solder ball.

In other words, in the etching process, an etching solution permeates from the upper portion of the connection pad 32 to its lower portion, so that the upper portion of the connection pad is more removed than the lower portion as the upper portion is exposed by the etching solution longer time than the lower portion, leaving a trapezoid shape. Thus, there is a limitation to form a fine circuit pattern 28 or a connection pad 32 in terms of thickness and width.

Second, because the circuit pattern 28 and the connection pad 32 are first formed and then the resin layer 30 or the solder resist is coated, the surface flatness is degraded due to the existence of the protruded circuit pattern 28 and the connection pad 32, resulting in a high possibility that the solder resist 30 may be cracked due to a thermal impact, and when a semiconductor chip is molded at the printed circuit board, a flow of the molding compound is not good.

Third, as shown in FIG. 3, the upper surface and the left and right surfaces of the connection pad 32 are exposed on which the copper plated layer 20 and the gold-plated layer 36 are formed. The gold-plated region is relatively enlarged and the gold-plated layer 36 is formed long in the downward direction of both sides of the connection pad 32, causing much problem for insulation between the adjacent connection pads. In addition, the thickness of the copper plated layer 20 and the gold plated layer 36 formed at the side makes it difficult to obtain a fine pitch.

SUMMARY OF THE INVENTION

Therefore, an object of the present invention is to provide a method for fabricating a printed circuit board capable of easily forming a fine circuit pattern.

Another object of the present invention is to provide a method for fabricating a printed circuit board capable of considerably reducing deficiency occurrence by improving a surface flatness of a printed circuit board and reducing a molding gap in a molding operation after a chip is mounted.

Still another object of the present invention is to provide a method for fabricating a printed circuit board capable of minimizing a gold plated area by forming a gold plated layer only at an upper surface of a connection pad and obtaining a fine pitch between connection pads.

To achieve these and other advantages and in accordance with the purpose of the present invention, as embodied and broadly described herein, there is provided a circuit pattern fabrication method of a printed circuit board including: a first step of forming a resin layer at a surface of an insulation material; a second step of selectively removing the resin layer; a third step of forming a metal plated layer at the surface of the resin layer-removed portion of the insulation material to form circuit patterns and a connection pad; and a fourth step of forming a gold plated layer on the connection pad.

In the circuit pattern fabrication method of a printed circuit board of the present invention, the metal plated layer is formed by a copper plating.

In the circuit pattern fabrication method of a printed circuit board of the present invention, the third step includes: forming a metal plated layer at a surface of the insulation material and at a surface of the remaining resin layer; removing the metal plated layer formed at the surface of the resin layer; and coating a solder resist at a surface of other portion than the portion where the connection pad is formed.

In the circuit pattern fabrication method of a printed circuit board of the present invention, the metal plated layer formed at the surface of the resin layer is removed by abrasion, and the resin layer and the metal plated layer are leveled through the abrasion process.

In the circuit pattern fabrication method of a printed circuit board of the present invention, the connection pad is formed in a rectangular shape without having a difference in width between a bottom portion attached at the insulation material and the upper portion.

In the circuit pattern fabrication method of a printed circuit board of the present invention, the gold-plated layer is formed only at the upper surface of the connection pad.

To achieve the above objects, there is also provided a method for fabricating a circuit pattern of a printed circuit board including: a first step of preparing an insulation material having a plurality of through holes; a second step of forming a resin layer at both surfaces of the insulation material; a third step of selectively removing the resin layer and forming a metal plated layer at both surfaces of the insulation material where the resin layer has been removed to form circuit patterns and a connection pad, and forming a metal plated layer inside the through hole to electrically connect the circuit patterns existing at both sides; and a fourth step of forming a gold plated layer on the connection pad.

To achieve the above objects, there is also provided a method for fabricating a circuit pattern of a printed circuit board including: a first step of forming a resin layer at a surface of an insulation material; a second step of selectively removing the resin layer to form a plurality of grooves; a third step of forming a metal plated layer on the groove to form circuit patterns and a connection pad; a fourth step of forming a gold plated layer at a surface of the connection pad; and a fifth step of removing the gold plated layer protruded from the surface of the resin layer.

In the method for fabricating a circuit pattern of a printed circuit board of the present invention, the third step includes: forming a metal plated layer inside the groove and at the surface of the resin layer; and removing the metal plated layer formed at the surface of the resin layer to form a connection pad and circuit patterns.

In the method for fabricating a circuit pattern of a printed circuit board of the present invention, the metal plated layer formed at the surface of the resin layer is removed by abrasion.

In the method for fabricating a circuit pattern of a printed circuit board of the present invention, the connection pad is formed with a thickness not higher than a depth of the groove, and an edge of the connection pad is protruded upwardly so as to be attached at the inner surface of the groove.

In the method for fabricating a circuit pattern of a printed circuit board of the present invention, in the fifth step, the resin layer is abraded to a certain thickness in order to remove the gold plated layer protruded from the resin layer and flatten the surface of the resin layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 4A to 4H are a sequential process of a method for fabricating a circuit pattern of a printed circuit board in accordance with a first embodiment of the present invention.

The method for fabricating a circuit pattern of a printed circuit board in accordance with a first embodiment of the present invention will now be described with reference to FIGS. 4A to 4H.

Figure 4A:
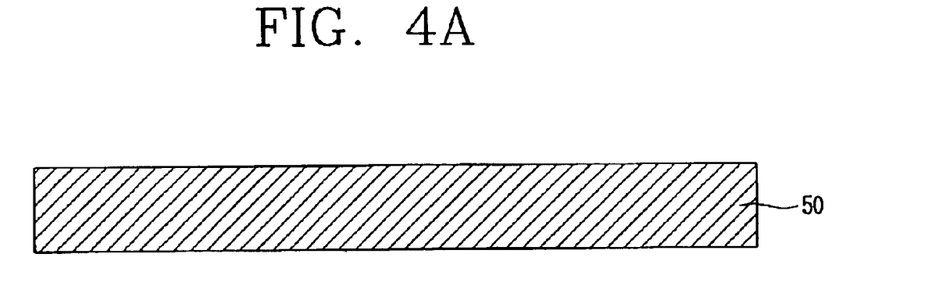
FIGS. 4A to 4H are a sequential process of a method for fabricating a circuit pattern of a printed circuit board in accordance with a first embodiment of the present invention.

First, with reference to FIG. 4A, an insulation material 50 with a predetermined thickness is prepared. The insulation material serves as a base material of a printed circuit board with a certain thickness and area.

Figure 4B:
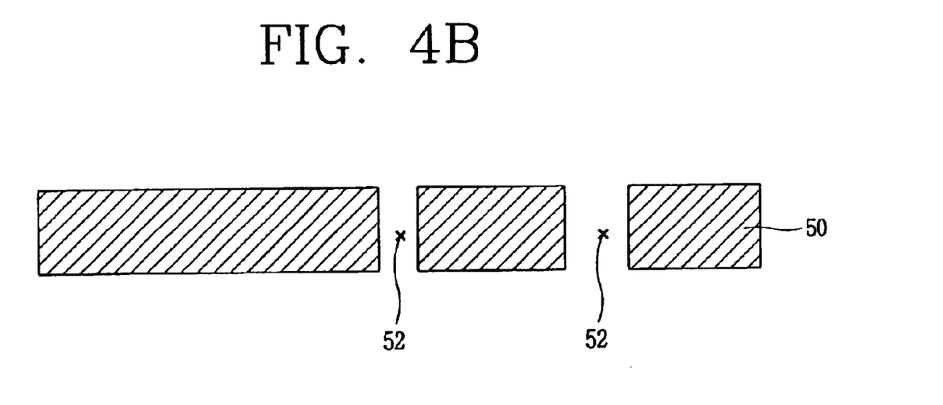

Next, as shown in FIG. 4B, a plurality of through holes 52 are formed at the insulation material 50. The through hole 52, serving as a connection path for electrically connecting circuit patterns formed at both surfaces of the insulation material 50, can be formed by a mechanical method using a drill or a laser or a chemical method.

Figure 4C:
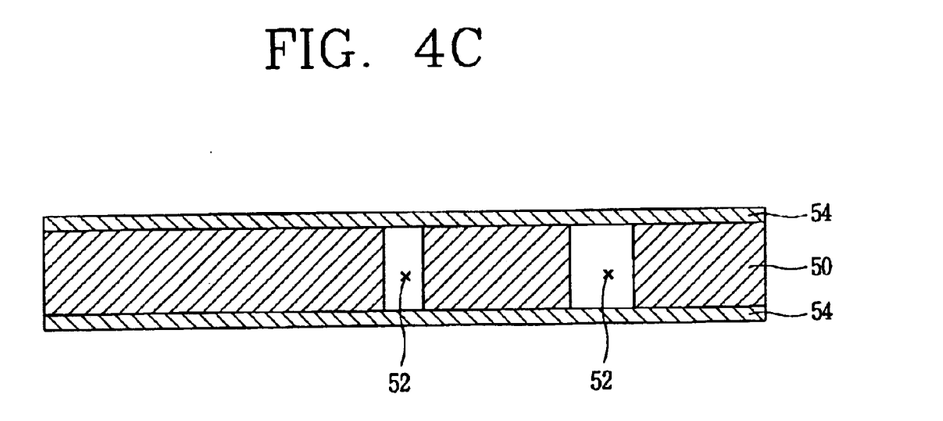

After the through hole 52 is formed, as shown in FIG. 4C, resin is coated at both surfaces of the insulation material 50 to form a resin layer 54. The resin layer 54 is not formed inside the through hole 52 formed at the insulation material 50.

Figure 4D:
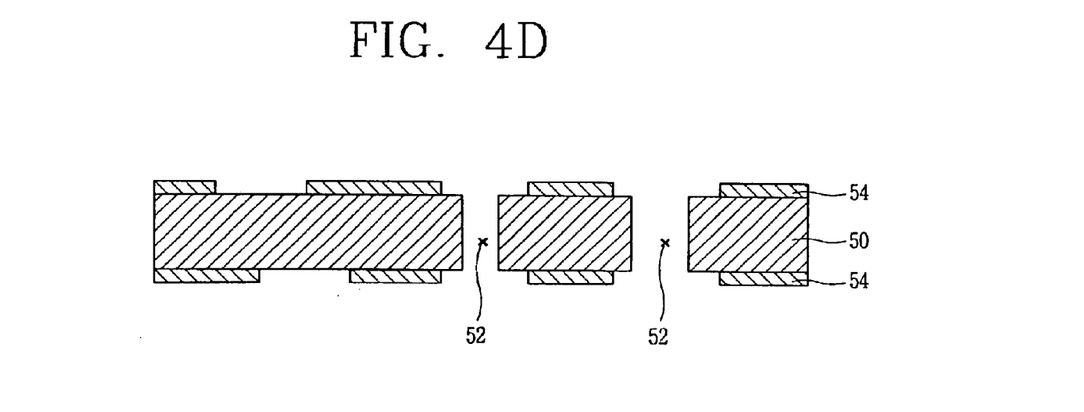

And then, as shown in FIG. 4D, the resin layer 54 is selectively removed. That is, the resin layer 54 is selectively removed from the portions where the through hole 52 has been formed and a circuit pattern is to be formed. At this time, the resin layer 54 can be removed through various method such as an exposing/developing method using ultraviolet, a method using laser or a mechanical routing method.

Figure 4E:
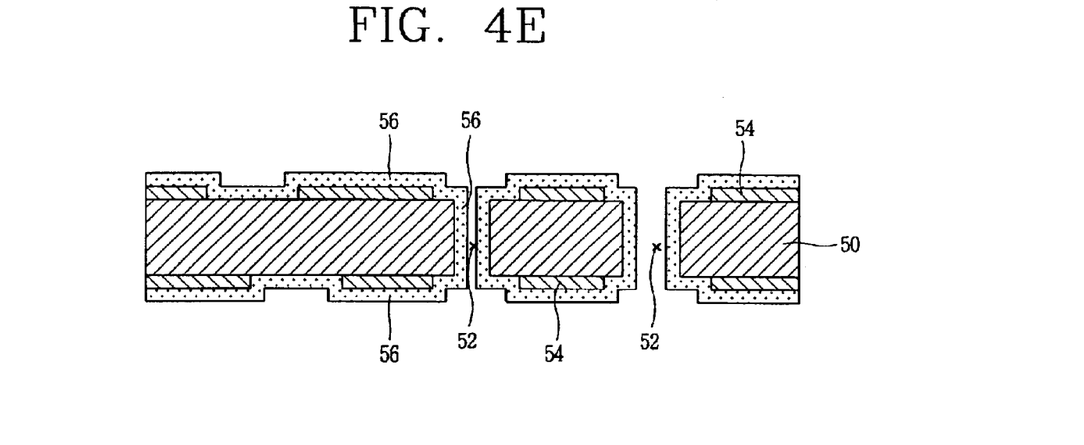

After the resin layer 54 is selectively removed, as shown in FIG. 4E, a metal plated layer 56 is formed at a surface of the insulation material 50. That is, the metal plated layer 56 is formed at the surface of the exposed insulation material 50, the surface of the resin layer 54 and inside wall of the through hole 52.

Figure 4F:
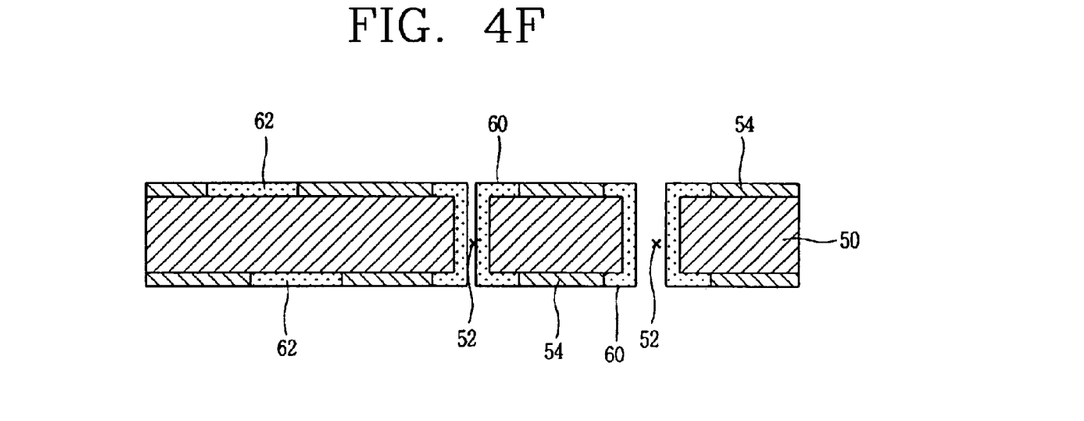

And then, as shown in FIG. 4F, the metal plated layer 56 formed at the surface of the resin layer 54 is removed by grinding. That is, the metal plated layer 56 is abraded with a certain depth so as to be removed. At this time, the resin layer 54 is also abraded to a certain degree to better a flatness of the overall surface.

After the abrading process is completed, the metal plated layer 56 remaining at the surface of the insulation material 50 becomes a circuit pattern 60 or a connection pad 62. Meanwhile, the metal plated layer 56 formed inside wall of the through hole 52 serves to electrically connect the circuit patterns 60 formed at both surfaces of the insulation material 50.

Figure 4G:
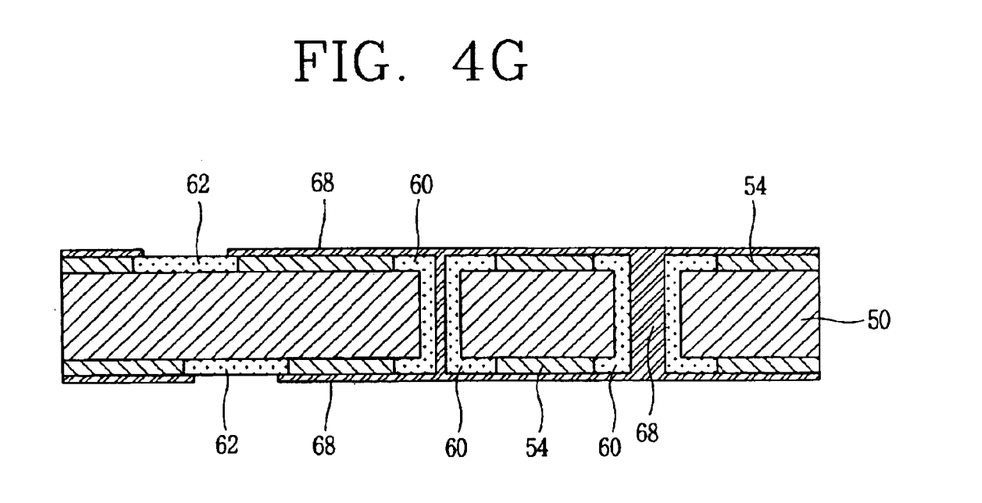

And then, as shown in FIG. 4G, a solder resist 68 is coated at a surface of the exposed circuit pattern 60 and the resin layer 54. At this time, the solder resist 68 is plugged also inside the through hole 52. As the solder resist 68, a photo solder resist is used.

The solder resist 68 is not coated at the portion of the connection pads 62 such as a bonding pad and a ball pad for electrical connection with other electronic parts, so that the connection pads are exposed.

Figure 4H:
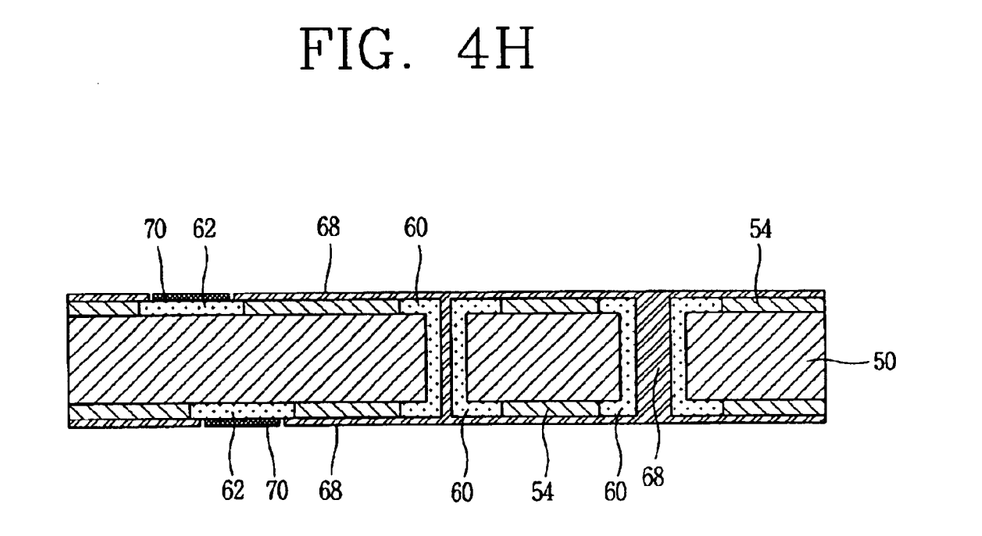

And then, as shown in FIG. 4H, a gold plated layers 70 are formed at an exposed surface of the connection pads 62, thereby completing a printed circuit board. The gold plated layers 70 make the connection wire or the solder ball to be firmly attached to the connection pads 62 to ensure electrical connection therebetween.

Figure 5:
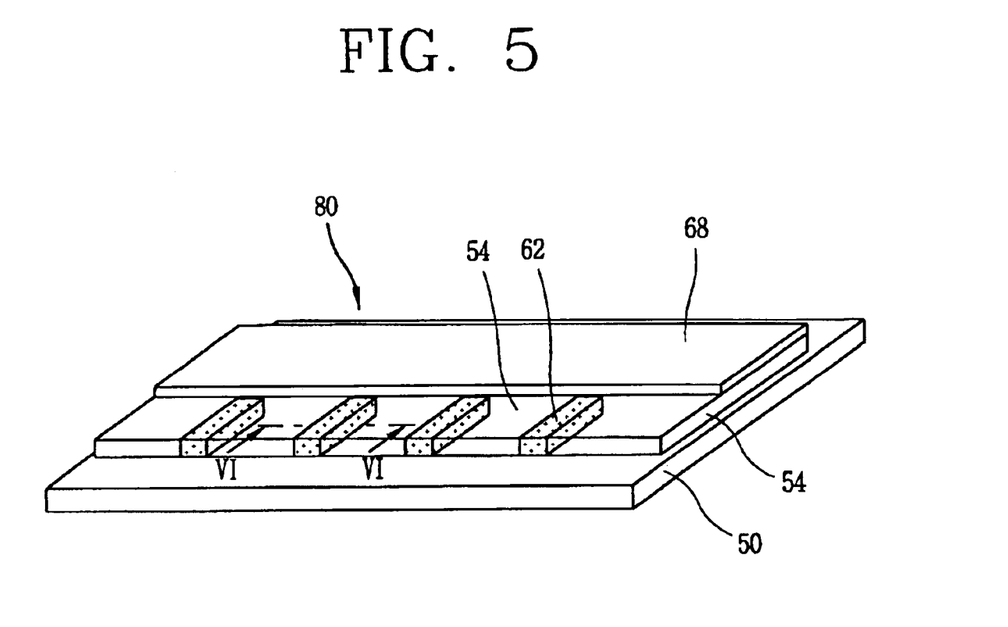
FIG. 5 is a partial perspective view showing a printed circuit board in accordance with the first embodiment of the present invention.
Figure 6:
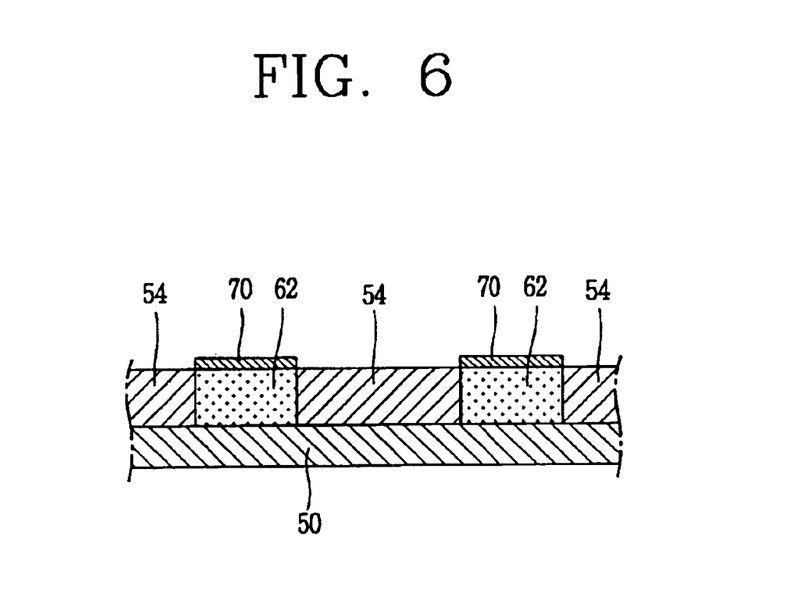
FIG. 6 is a sectional view taken along line VI—VI of FIG. 5.

FIG. 5 is a partial perspective view showing a printed circuit board in accordance with the first embodiment of the present invention, and FIG. 6 is a sectional view taken along line VI—VI of FIG. 5.

A printed circuit board 80 fabricated according to a first embodiment of the present invention is featured in that the plurality of connection pads 62 are consecutively arranged at regular intervals, the resin layer 54 is plugged between the connection pads 62, and the resin layer 54, the connection pad 62 and the circuit patterns 60 are formed with the same height, so that a completed printed circuit board 80 has a plane surface.

The operation and effect of the printed circuit board completed according to the fabrication process will now be described.

In the circuit pattern fabrication method in accordance with one embodiment of the present invention, the resin layer 54 is coated at the surface of the insulation material 50 and partially removed, the metal plated layer 56 is formed at the surface of the resin layer 54 and the exposed surface of the insulation material 50, and then, the metal plated layer 56 formed on the resin layer 54 is removed through the abrading process, to form the circuit patterns 60 and the connection pads 62. Accordingly, as shown in FIG. 6, there is no width different between the bottom part attached at the insulation layer 50 of the connection pads 62 and the exposed upper portion, forming a rectangular type. Thus, it is easy to attach the gold wire or the solder ball at the upper surface of the connection pads 62 and the size of the connection pads 62 can be reduced, so that a fine circuit pattern can be easily formed.

In addition, the connection pads 62 are covered by the resin layer 54, the gold plated layers 70 are formed only at the upper surface of the connection pads 62 in a gold plating operation. Accordingly, because the metal plated layer 56 and the gold plated layers 70 are not formed at the side of the connection pad pads 62, the connection pads 62 can be relatively reduced in width, and accordingly, a pitch between the connection pads 62 becomes narrow, facilitating forming of a fine circuit pattern.

In addition, because the resin layer 54 and the circuit patterns 60 are formed to be level by the abrading process, the solder resist 68 coated on the resin layer 54 and the circuit patterns 60 can have a relatively high flatness. Accordingly, when a printed circuit board with a chip mounted thereon is molded, a flow of molding compound is smoothly performed, so that generation of a mold gap can be reduced.

In addition, the metal plated layer 56 is formed at the surface of the insulation material 50 exposed as the resin layer 54 is removed therefrom and then the abrading process is performed to flatten the surface. Therefore, it is not necessary to control a deviation in a thickness of the metal plated layer in its formation, so that a productivity can be improved, a fabrication cost can be reduced, and an operation is convenient to perform.

FIGS. 7A to 7E are a sequential process of a method for fabricating a circuit pattern of a printed circuit board in accordance with a second embodiment of the present invention.

Figure 7A:
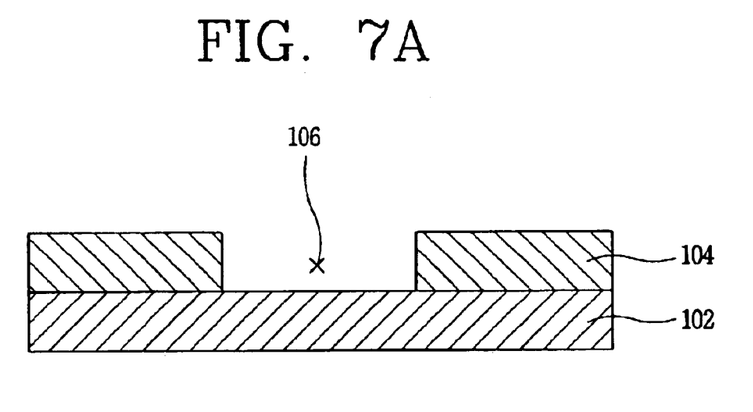
FIGS. 7A to 7E are a sequential process of a method for fabricating a circuit pattern of a printed circuit board in accordance with a second embodiment of the present invention.

First, with reference to FIG. 7A, a resin layer 104 is formed on an insulation material 102 with a predetermined thickness and then selectively removed. That is, the resin layer 104 at a portion where a circuit pattern is to be formed is selectively removed to form a groove 106. At this time, the resin layer 104 can be removed by various methods such as the exposing/developing method using ultraviolet ray, a method using laser or a mechanical routing method.

Figure 7B:
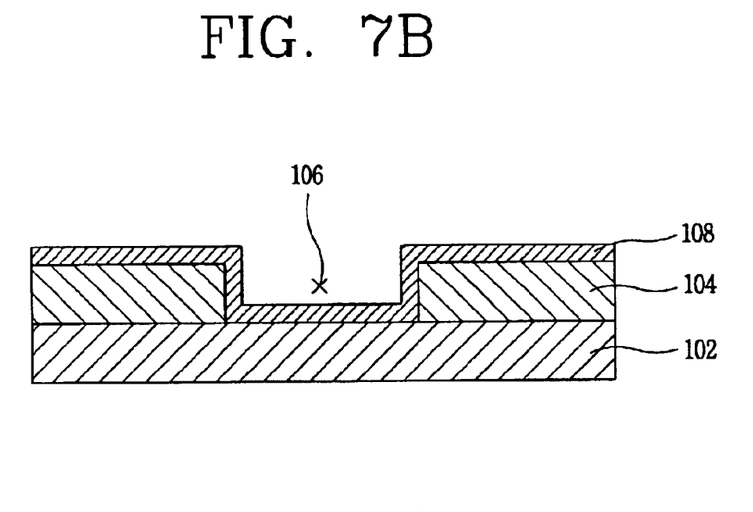

After the resin layer 104 is selectively removed, as shown in FIG. 7B, a metal plated layer 108 is formed at a surface of the insulation material 102. At this time, the metal plated layer 108 is formed at the exposed surface of the insulation material 102 and the surface of the resin layer 104 by using a chemical plating method.

Figure 7C:
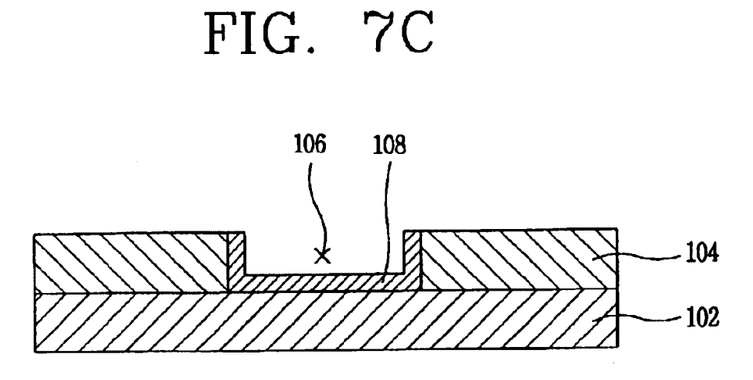

And then, as shown in FIG. 7C, the metal plated layer 108 formed at the surface of the resin layer 104 is removed. That is, the metal plated layer 108 formed at the surface of the resin layer 104 is abraded to a certain depth so as to be removed. After the abrading process, the metal plated layer remaining at the surface of the insulation material 102 becomes a connection pad 116 or circuit patterns (not shown).

In this respect, the groove 106 is formed with a predetermined depth in the resin layer 104 and the connection pad 116 is formed with a thickness smaller than the depth of the groove 106, so that the upper surface of the connection pad 116 is positioned at the inner side of the groove 106. Accordingly, an edge of the connection pad 116 is protruded upwardly and attached at the inner wall surface of the groove 106.

Figure 7D:
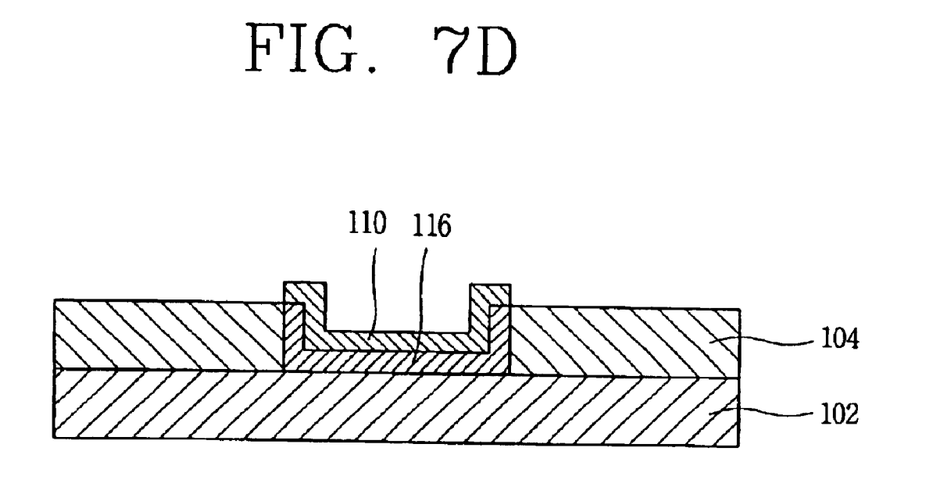

And then, as shown in FIG. 7D, a gold plated layer 110 is formed at the exposed surface of the connection pad 116. The gold plated layer 110 is formed by an electroplating method supplying power to the connection pad 116 exposed at the surface of the resin layer 104.

Because the connection pad 116 is positioned at the inner side of the groove 106 and its edge is protruded, an edge of the gold plated layer 110 is attached to the protruded edge of the connection pad 116.

Figure 7E:
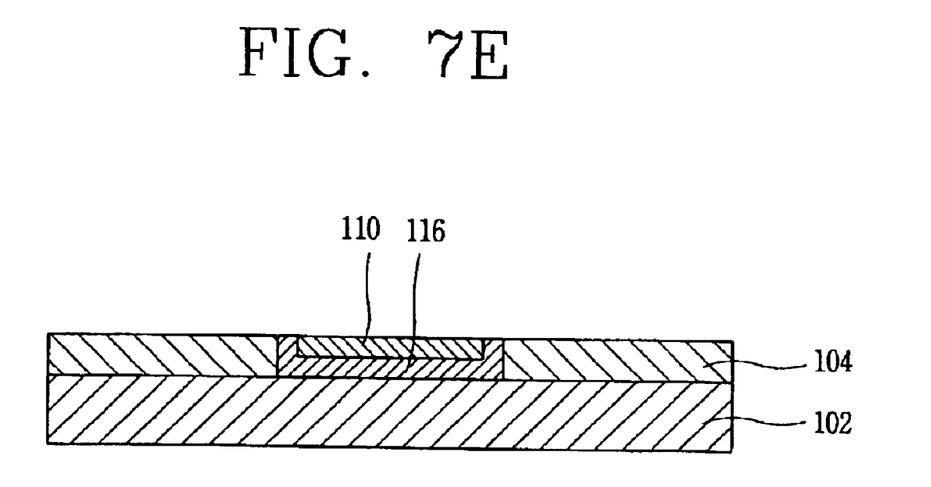

After the gold plated layer 110 is formed, as shown in FIG. 7E, the resin layer 104 is abraded to a predetermined thickness so that the gold plated layer 110 protruded from the surface of the resin layer 104 is removed and the surface of the resin layer 104 can be flattened.

The gold plated layer 110 makes the connection wire or the solder ball be firmly attached to the connection pad 116 to ensure an electric connection.

As stated above, the circuit pattern fabrication method in accordance with the second embodiment of the present invention has the following advantages.

That is, first, because the edge of the connection pad 116 is protruded upwardly and attached inside the groove 106 formed on the resin layer 104, the gold plated layer 110 can be coated in a wide area. Accordingly, the gold wire or the solder ball can be easily attached at the upper surface of the connection pad 116, and because the connection pad 116 can be reduced in size, a fine circuit pattern can be easily formed.

Second, the edge of the connection pad 116 is protruded and the edge of the gold plated layer 110 is attached to the edge of the connection pad 116 during the gold plating operation. Thus, the width of the connection pad 11 can be relatively reduced, and accordingly, the pitch between the connection pads 116 can become narrow, so that a fine circuit pattern can be easily formed.

Third, after the gold plated layer 110 is formed, the abrading process is performed to flatten the surface. Thus, it is not necessary to control a deviation in thickness of the gold plated layer in its formation, so that a productivity can be improved, a fabrication cost can be reduced, and an operation is convenient to perform.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A circuit pattern fabrication method of a printed circuit board comprising:

providing an insulation material;

forming through holes in the insulation material;

forming a resin layer on a front surface and a rear surface of the insulation material;

selectively removing portions of the resin layers;

forming a metal plated layer at the surface of the resin layers, the resin layer-removed portions of the insulation material and the through hole portions of the insulation material;

removing the metal plated layer from the surface of the resin layers; and forming a gold plated layer on the metal plated layer at the surface of the resin layer-removed portions.

2. The method of claim 1, wherein the forming of the metal plated layer comprises plating with copper.

3. The method of claim 1, wherein removing the metal plated layer step further comprises:

coating a solder resist on the resin layers and the metal plated layer on the through hole portions of the insulation material.

4. The method of claim 1, wherein the removing of the metal plated layer comprises abrasion.

5. The method of claim 1, further comprising leveling the resin layers and the metal plated layer by abrasion.

6. The method of claim 1, wherein a connection pad is formed-by the combination of the metal plated layer and the gold plated layer.

7. The method of claim 1, wherein the gold-plated layer is formed only on the metal plated layer at the front and rear surfaces of the insulation material.

8. The method of claim 1, wherein forming the metal plated layer comprises applying a metal plated layer to the front and the rear surfaces of the insulation material, the through holes and the resin layers, wherein said removing said metal plated layer from surfaces of the resin layers conductively separates metal plated layer portions on the front and rear surfaces of the insulation material from metal plated layer portions in the through holes.

9. The method of claim 1, wherein said forming of the metal plated layer comprises forming conductive circuit patterns and connection pads of the printed circuit board.

10. The method of claim 1, wherein said forming of the metal plated layer comprises forming a conductive metal layer directly in contact with the resin layers and the front and rear surfaces of the insulation material.

11. A method for fabricating a circuit pattern of a printed circuit board comprising:

preparing an insulation material having a plurality of through holes;

forming resin layers at both surfaces of the insulation material;

selectively removing portions of the resin layers;

forming metal plated layers at both surfaces of the insulation material where the resin layers have been removed;

forming metal plated layers inside the plurality of through holes; and forming a gold plated layer on the metal plated layers where the resin layers have been removed.

12. The method of claim 11, wherein the forming of the metal plated layers comprises plating with copper.

13. The method of claim 11, wherein the forming of the metal plated layers comprises:

forming metal plated layers at a surface of the insulation material, at a surface of the resin layers and at the inner side of at least one of the plurality of the through holes;

removing the metal plated layers formed at the surface of the resin layers separating the metal plated layers at the surface of the insulation material and at the inner side of the at least one of the plurality of through holes; and coating a solder resist at the surfaces of the metal plated layers at the surface of the insulation material and at the inner side of the at least one of the plurality of through holes.

14. The method of claim 11, wherein the removing of the metal plated layers comprises abrasion.

15. The method of claim 14, further comprising leveling the resin layers and the metal plated layers by abrasion.

16. The method of claim 11, wherein a connection pad is formed by the combination of the metal plated layers and the gold plated layers.

17. The method of claim 11, wherein the gold-plated layer is formed only at front and rear surfaces of the insulation material.

18. The method of claim 11, wherein said forming of the metal plated layers comprises forming conductive circuit patterns and connection pads of the printed circuit board.

19. The method of claim 11, wherein said forming of the metal plated layers comprises forming a conductive metal layer directly in contact with the resin layers and the top and bottom surfaces of the insulation material.

* * * * *